United States Patent [19]

Johnson et al.

[11] Patent Number: 4,926,439
[45] Date of Patent: May 15, 1990

[54] PROCESS FOR PREVENTING CONTAMINATION OF HIGH TEMPERATURE MELTS

[75] Inventors: Neil A. Johnson, Schenectady; Russell S. Miller, Ballston Spa, both of N.Y.; Gordon B. Hunter, Loveland, Ohio

[73] Assignee: General Electric Company, Schenectady, N.Y.

[21] Appl. No.: 404,398

[22] Filed: Sep. 7, 1989

[51] Int. Cl.$^5$ .................... H01J 37/305; H05H 7/00
[52] U.S. Cl. ........................................ 373/10; 373/18; 219/130.01
[58] Field of Search ................................. 373/10–14, 373/18, 21, 22, 25, 104, 105, 102; 219/130.01, 124.34, 121.86, 121.54

[56] References Cited

U.S. PATENT DOCUMENTS 3,437,734 4/1969 Roman et al. .................. 373/14
3,562,141 2/1971 Morley ............................ 373/11

Primary Examiner—Roy N. Envall, Jr.
Attorney, Agent, or Firm—Paul E. Rochford; James C. Davis, Jr.; James Magee, Jr.

[57] ABSTRACT

A method of reducing "fall back" contamination caused by high intensity heating of metals is taught. Splatter, vapor droplets and particulate matter resulting from the high intensity heating is repelled to avoid return to the melt. An electric field is established above the heating zone to repel the vapor droplets and particles from at least one charged electrode disposed above the surface where high intensity heat is applied to a metal surface.

14 Claims, 1 Drawing Sheet

PROCESS FOR PREVENTING CONTAMINATION OF HIGH TEMPERATURE MELTS

CROSS REFERENCE TO RELATED APPLICATIONS

The present invention relates generally to the subject matter of Ser. No. 390,052 (RD-19,148), filed Aug. 7, 1989; and Ser. Nos. 07/376,094 and 07/376,095, filed July 6, 1989. The texts of these cross referenced applications are included herein by reference.

BACKGROUND OF THE INVENTION

The present invention relates generally to the melt processing of high temperature metals. More specifically, it relates to methods by which the contamination of high temperature melts can be reduced, prevented and/or avoided.

It is known that in the processing of lower temperature melts of metals contamination from atmospheric oxidation or from impurities introduced into the melt from the melt crucible, or from dust particles is at an exemplary low level. Ordinary procedures and practices permit melting and casting to be accomplished without exceeding the acceptable levels of impurities in such metals. Metals, such as lead, zinc, tin, bismuth, as well as alloys such as brasses, bronzes, and the like, have been usefully and successfully processed through a melt phase without impairment of the solid product metal through the introduction of an excessive level of impurities or contaminants due to the processing. Such metals are melted at lower melting temperatures of the order of a hundred to a few hundred degrees. Heat can be delivered to such melts through their containing crucible and such heating generates very little vaporous or particulate matter.

For metals which melt at higher temperatures, and particularly above about 1000° C., the techniques employed in the melting and the techniques for keeping the melt free from contamination, either from the atmosphere or from impurities, are of a different character.

In the first place, the means used for melting the metals which melt at much higher temperatures are different and, in the case of highly reactive metals such as titanium, may involve the use of a plasma flame or an electron beam or similar melting technique. The application of heat from such sources to the metal of the melt is directly onto the melt surface rather than through a crucible wall. In addition, because of the high reactivity of metals such as titanium, the metal must be protected from ordinary oxygen and nitrogen containing atmosphere. Further, because metal such as titanium is highly reactive with any crucible material, the metal is melted in a cold skull type of crucible in which a layer of solid titanium serves as the crucible for the liquid or molten titanium. Because of these unique circumstances, and because of the nature of the vaporous droplet and particulate material which is generated from the furnacing and melting of the high melting metal materials, special problems arise.

One such problem involves the deposit of vaporous and particulate material on the inside surfaces of enclosures provided to protect the molten metal from contact with ordinary atmospheres. The degree of vaporization and formation of particulate material is quite high for the high melting materials, at least partly because of the nature of heat delivery in the melting process itself. Heat is delivered from high temperature sources and is delivered at high intensity to a metal or melt surface. Plasma torch heat is delivered at temperatures in excess of 10000° C., for example. Thus, it has been found that there is a substantial amount of vaporous and particulate material generated from the use of plasma flames directed downward onto the top of a melt in a cold hearth crucible. This vaporous and particulate matter deposits on all interior surfaces of the containing vessel. Also, where electron beam heating is employed, a substantial amount of sputtering, spattering, and dissipation of the solid and liquid material occurs to the degree that there is a formation on all of the internal surfaces of the enclosing vessel of a deposit of the vaporized, and/or particulate material.

As the use of the vessel continues, there is a tendency for the surface deposited material to flake and to drop off in a manner which permits contamination of the melt. Where a tank or vessel is employed in the melting or melt processing of a number of different alloys, one danger is that the deposit formed during processing of one alloy will flake off and fall into the melt of a different alloy thereby contaminating the later processed alloy.

Efforts are made to avoid such contamination and may involve cleaning of the furnace interior between runs. However, another problem occurs during a single run and cannot be cured by cleaning between runs. This problem is that the condensate on a vessel interior has a much higher concentration of the more volatile elements, such as aluminum, than the melt from which the vapor is generated. The aluminum content of a titanium alloy containing 6% aluminum originally may be as high as 50%. When this condensate forms during a single run and drops into the melt just prior to casting, substantial property disparities can result in the casting.

Another type of processing of metals having high melting temperatures is the rapid solidification plasma deposition. In this process particles of the metal to be melted are entrained in a carrier gas and are passed through a plasma flame. The production of fine particulate solids and of metal vapors during plasma spray processing of a powder through a melt phase is similar to that which occurs during the high temperature melting processes described above.

The portion of an enclosing vessel which is particularly susceptible to deposits which can enter the melt is the portion directly over the target mandrel. Flakes of deposit which fall from this "ceiling" portion of the vessel are directly over the mandrel or melt and can fall directly onto or into the mandrel or melt.

BRIEF STATEMENT OF THE INVENTION

It is, accordingly, one object of the present invention to provide a method which limits the contamination of melts processed in high temperature melting apparatus.

Another object is to provide an apparatus which permits the level of contaminants to be limited or reduced.

Another object is to provide a method for melt and/or plasma processing of high temperature melts, such as nickel based superalloys with reduced contamination.

Another object is to provide a method for melt processing of highly reactive metals such as titanium alloys with lowered contamination resulting from the processing.

Other objects will be in part apparent and in part pointed out in the description which follows.

In one of its broader aspects, objects of the present invention can be achieved by providing a furnace enclosure in which the heating of a metal at a very high rate and to a very high temperature is accomplished. The application of heat to the metal is preferably done at the upper surface of the melt by a high intensity heat source such as a plasma torch or an electron beam or similar high intensity heating source. A melt may be contained within a skull of the same metal to avoid its contamination by reaction with a containing vessel. Also the highly intense application of heat occurs at a particle surface during plasma heating of a stream of particles such as occurs during melt processing of the particles in forming a plasma spray deposit of metals onto a receiving surface. The high intensity heating causes a cloud-like fog of vaporous and/or particulate matter to form within the furnace chamber. Such matter is formed by the application of high intensity heating in a heating zone at the surface of the metal. To reduce the particulate cloud and the surface deposit on the walls of the enclosure, at least one metal electrode is provided within the chamber directly above the heating zone. At least one electric charge is applied to the metal electrode to cause an electric field to be established within the zone. This electric field causes repulsion of vaporous and/or particulate matter from the heating zone and precludes deposit of such material on the charged surface directly above the heating zone. Deposit of the vaporous and/or particulate matter does occur on other surfaces within the chamber including side wall surfaces. This reduction or prevention in deposit occurs on surfaces directly above the heating zone and accordingly on the surfaces from which the deposits might fall into the melt to contaminate the melt or to contaminate a plasma deposited molten metal layer.

By vaporous, as used herein, is meant material which leaves the heated metal surface as a vapor. It is realized, however, that such material quickly forms droplets as it leaves the high intensity heat zone where it is formed. Also, it is realized that such droplets quickly freeze to particles if they enter a zone where the ambient temperature is below their freezing point.

Alternatively, material which remains a vapor may condense on the walls or other surfaces within the enclosing vessel.

BRIEF DESCRIPTION OF THE DRAWINGS

The description of the invention which follows will be understood with greater clarity if reference is made to the accompanying drawings in which.

DETAILED DESCRIPTION OF THE INVENTION

Figure 1:
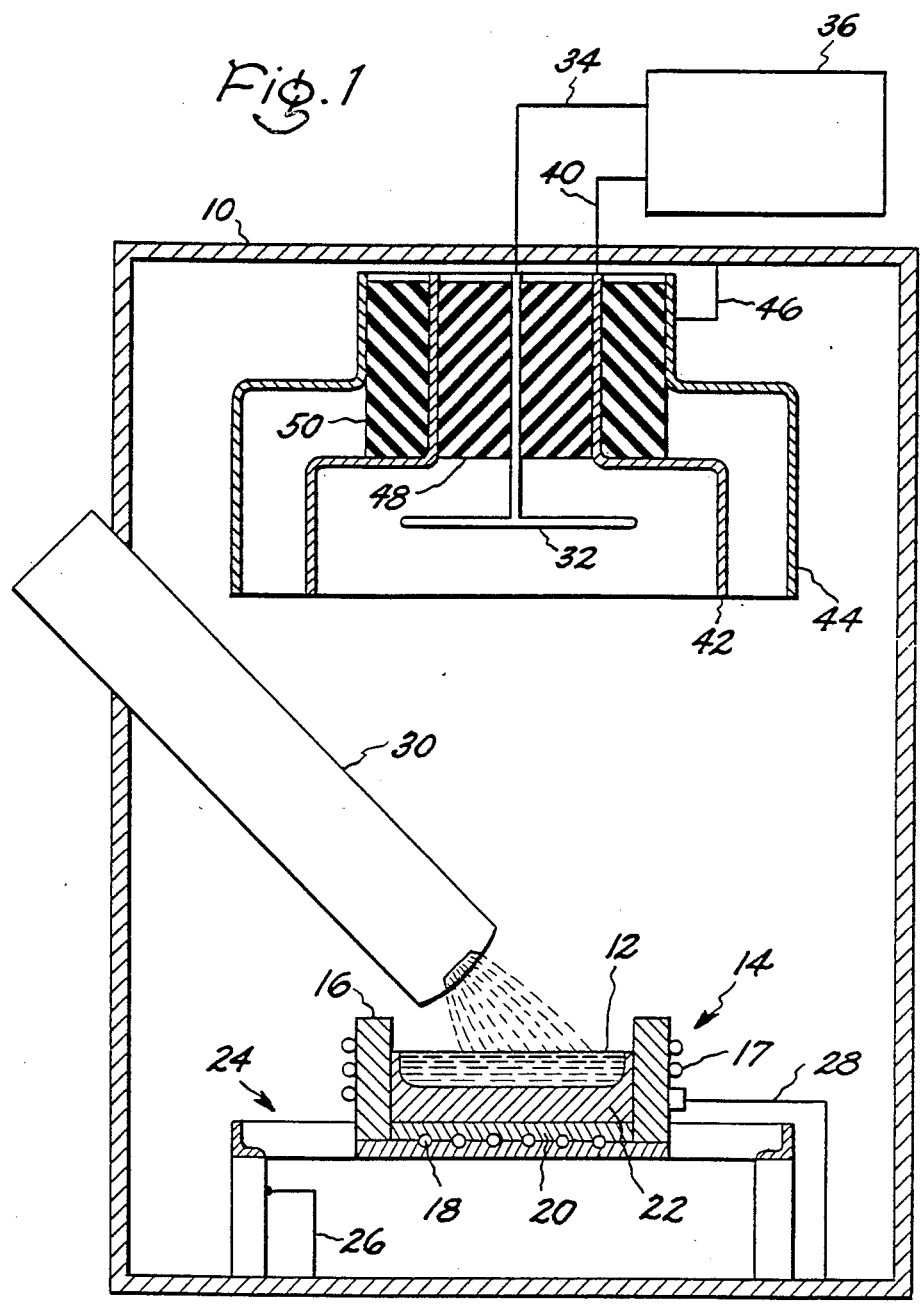
FIG. 1 a schematic view of a enclosure as of a furnace in which high intensity surface heating of a metal may be carried out.

We have found that when a furnace is operated continuously by Plasma Arc Melting (PAM) or by Electron Beam Melting (EBM) processes, or when Rapid Solidification Plasma Deposition (RSPD) is carried out, particulate matter which is generated from these processes deposits on interior surfaces within the enclosure. These deposits occur on essentially all internal surfaces of the enclosure including on internal surfaces located over RSPD deposited surface layers as well as over molten metal pools. In time the deposits become thick enough to break loose and flake off and to drop into the metal pool. Some of these deposits are rich in oxygen. Others have disproportionate concentrations of ingredients as explained above. The finely divided material formed by the plasma arc melting or electron beam melting processes absorbs or reacts with oxygen readily and the oxide bearing deposit is rarely, if ever, identical in composition to the composition of the final alloy or deposit to be produced by the processing and in this sense represent an unwanted and potentially harmful addition to the alloy pool or to an RSPD receiving surface. Efforts have been made heretofore to reduce or eliminate such "fall back" contamination.

In a number of PAM furnaces, constant flowthrough of gas removes a portion of the particulate matter formed but such gas throughput would have to be increased many times in order to eliminate such deposits. In the EBM processing, a grate has been positioned over the melt in order to capture particulate matter and to provide a more reliable bond of the deposited particulate to the surfaces over the melt pool. The idea is that if the particulate matter adheres more strongly to the grate surface as it has a larger collection surface and, there is therefore a reduced chance that it will break loose and fall into the melt pool. These passive techniques, such as positioning a grate over the melt pool or large volume gas purging, has met with limited success and improvements in the processing and in the apparatus used for these techniques are needed.

In the RSPD processing, the danger is that surface deposits will flake off the enclosure interior and will fall onto the receiving surface and be embedded in the RSPD surface deposit thus creating an inclusion or defect in the surface structure or alloy composition.

Based on the experimental work we have done we deem it possible to substantially avoid the formation of particulate deposits on a surface over the melt or over an RSPD surface deposit. This reduction in the deposit of vaporous and particulate material on surfaces of a processing enclosure from which such deposit may fall onto and/or into and contaminate the melt or plasma deposit may be accomplished by placing at least one electrode in the enclosure at a position directly above the melt surface.

We found the particulate in the furnace chamber to be charged. We inferred the existence of the charge from the fact that the particulate matter is attracted to an oppositely charged plate. Accordingly, we concluded that we would be able to influence the disposition of the particulate matter by inducing an electric field within the chamber to apply attractive and/or repulsive force to the particulate matter.

Based on our experiments, we have found that the particulate matter in the processing furnaces is very fine and that, to a large degree, the fine particles carry a charge. Our experiments have demonstrated that in certain processing apparatus the particulate material is almost exclusively negatively charged and the application is described in terms of a negatively changed particulate material. However, the principal experimental finding is that the particles are predominantly of a single charge, and the particulate matter may be dealt with effectively because it bears a single charge. The particle size of the particulate matter is to a large degree smaller than one micron. Based on the combination of particle size and charges which are carried by the particles, we have succeeded in attracting a significant fraction of the particles to a charged plate. Conversely, we have been successful in repelling essentially all charged particles from a plate charged to bear the same electric charge as that on the particles. To our knowledge, no effort has been made heretofore to repel particulate matter from surfaces directly above the exposed surface of a melt by use of an electrically charged plate or other electrode of a configuration to generate an electric field which repels such particles.

In order to accomplish or to influence the particle repulsion, at least one conductive electrode must be located within the furnace enclosure directly over the melt surface or over the RSPD deposit surface. At least one such conductive electrode is so positioned although more than one may be used.

A conductive electrode was charged with relatively high voltage, of the range of 10–30 kilovolts, in an experimental apparatus, and a power supply was provided capable of delivering relatively small currents of the order of milliamps to the conductive surface.

The charge on a repelling conductive electrode must be the same as that on the particles. The higher the voltage employed the higher the degree of particle repulsion but the voltage should not be so high as to cause undesirable side effects such as arcing or the like. Such arcing or breakdown is a function of the type of atmosphere, the pressure, the temperature and other factors as well as the particle density, particle type and other like factors. Care must also be exercised in the use of magnetic or electric fields in connection with electron beam heating to avoid redirecting the beam from the intended target.

We have found that a negatively charged electrode, such as the surface of a plate in our experiments, remained very clean. However, a substantial fraction of the particles in the enclosure appeared to be deposited on a positively charged plate. For convenience of reference as used herein the term furnace enclosure designates an enclosure in which high intensity heating of metal specimens takes place. The high intensity heating can be by PAM, by EBM, by RSPD or by any other method which delivers high temperature heat rapidly to a metal surface, whether liquid, solid or solid particulate.

High intensity heating by a plasma flame occurs because the plasma flame involves high temperature ionization of gas and the operating temperature of a plasma is usually over 10,000° C. and contact of such a plasma flame with a metal specimen delivers heat to the metal specimen at high temperature and accordingly at a high rate. The same high rate of heating occurs when the heating is done by transferred arc.

The method by which the invention is carried out may be described by referring to the accompanying FIG. 1. The Figure is schematic in that the relation of various parts of an apparatus are depicted but the details of mechanical support of the various mechanical parts are not included as they are readily apparent to those skilled in the art and are not essential to practice of the invention.

Referring now to the Figure an enclosure 10 houses an apparatus for the high intensity heating of a metal specimen. The metal 12 to be heated is contained within a hearth 14. The hearth is made up of a copper crucible 16 having cooling tubes 18 embedded in the base 20 and positioned about the sides 17 to cool the copper body of the hearth 14. The cooling results in the formation of a skull 22 surrounding the melt 12 and thereby avoiding contamination of the melt by material of the hearth. The hearth 14 is supported on a frame 24. The frame 24 is grounded by ground wire 26, and also the hearth 14 is grounded by ground wire 28.

Heat is supplied by a plasma torch 30 positioned above the melt so as to direct the heat of the torch onto the upper surface of melt 12. The current supply and gas supply to torch 30 are not illustrated as they play no part in the subject invention.

When ignited the torch has an arc extending between elements internal to the torch. The torch flame extends from the gun due to the flow of gas through the arc. However, after ignition the arc may extend from the cathode of the gun to the surface of the melt by a transfer arc operation to continue the high intensity heating at the upper surface of the metal. This high intensity heating occurs because the temperature of the plasma from the torch is at 10,000° C. or higher and there is accordingly an application of high intensity heating to the surface of the melt because of the very high temperature at which heat is delivered to the melt surface. What attends the high intensity heating of the melt surface is a generation of vapor and particulate material of very fine particle size. Similar generation of vapors and particulate material accompanies other forms of high intensity heating such as heating with electron beam or other means. In addition, the same type of vapors and particulate matter is generated when a plasma arc is operated to plasma spray deposit particles of a material which are passed through the plasma flame onto a receiving surface. For each of these melt processing operations which involve the application of high intensity heat to a metal surface there is an accompanying production of vapors and particulate material for which the subject invention provides some advantages.

It is recognized by those who employ equipment for melt processing of high melting alloys through the application of high intensity heating that the vaporous and particulate material which is formed as a by-product of such processing has a tendency to deposit on all exposed internal surfaces within the chamber where such processing takes place.

A recognized undesirable side effect of such deposit is the flaking off of the deposit to form contaminating flakes. Where such flakes fall from directly above the melt surface contamination of the melt results.

To overcome such contamination pursuant to the present invention a charged electrode is disposed above the melt surface in a position where it will repel deposit of the vaporous and particulate matter from an area as large as or larger than the melt surface. Such an electrode may have the form of a plate, a screen, a grid or a shaped rod capable of generating a strong radial electric field. In this way, the formation of contaminating flakes of particulate matter is largely avoided and precluded.

With reference again to the Figure 1, a charged plate 32, which serves as a repulsion electrode, is positioned above the melt 12. The plate is charged from the power supply 36 and the charge is made the same as the charge on the particles within chamber 10. The charge is applied to plate 32 through conductor 38. An annular collection shield 42 may have an opposite charge to that on plate 20 and may be helpful in this way in inducing a collection of particles repelled from plate 32. Collection shield 42 is charged by conductor 40 from power source 36.

An annular ground 44 is illustrated as disposed about the collection shield. A ground wire 46 connects ground 44 to the enclosure 10.

Annular insulators 48 and 50 provide the insulating action by which the voltage is maintained at one value on electrode 32 and at a different valve on a collection shield 42 and at a still different valve on ground shield 44.

An electric field is formed in the chamber between the three differently charged shields, i.e., the repulsion shield 30; the collection shield 42, and the ground shield 44. This electric field acts on the charged particles within the chamber.

A high voltage of 5 KV to 30 KV or higher may be used in charging the plate 32 within the apparatus. An industrial apparatus could beneficially use voltages of 50 or 80 KV or higher. The charge polarity on plate 32 must be the same as the charge polarity on the particles to be repelled. When the charge on the particles is found to be negative, the charge placed on plate 32 is likewise negative. Conversely, where the particles are positively charged the plate 32 is positively charged.

We have found surprisingly that while the surface of the plate facing the melt repels particles, the back face of the plate does collect a deposit of particles. This has been inferred to be a collection of particles which lose their charge at the chamber wall or elsewhere and then are attracted to the reverse side of plate 32.

What is claimed is:

1. The method of reducing contamination of melts melted by high intensity heat sources which comprises,
   providing a enclosure in which such melting is to be accomplished,
   providing an inert atmosphere or vacuum in said enclosure,
   applying heat at high intensity to a metal in a heating zone within said enclosure,
   providing at least one electrode in said enclosure directly over the heating zone, and
   applying a charge to said at least one electrode to create an electric field in said zone to induce repulsion of the particulate and vaporous material emanating from said heating zone and to preclude deposit of particulate matter above said melt.

2. The method of claim 1 in which the enclosure is a furnace enclosure.

3. The method of claim 1 in which the polarity of the charge on the electrode is the same as the polarity of the charge on the particulate material.

4. The method of claim 1 in which the electrode is the surface of a metal plate.

5. The method of claim 1 in which there is more than one electrode in said enclosure.

6. The method of claim 1 in which there is more than one electrode in the enclosure and the electrodes are at different voltages.

7. The method of claim 1 in which there are two electrodes in the enclosure which are electrically isolated from each other and from the enclosure.

8. The method of claim 1 in which there are two electrodes in the enclosure and they are oppositely charged.

9. The method of claim 1 in which there are two electrodes in the enclosure and a difference in potential of 5 to 80 kilovolts is imposed between the two electrodes.

10. Apparatus for melt processing of metals having high melting points which comprises,
    an enclosure containing said metal and means for applying high temperature heat to the surface of said metal at a high rate whereby vaporous and particulate matter is produced,
    at least one electrode in said container positioned over the surface where high intensity heat is applied to said metal surface, and
    means for imposing a charge on said electrode to repel deposit of particulate matter onto said charged electrode.

11. The apparatus of claim 10 in which there is more than one charged electrode in said enclosure.

12. The apparatus of claim 10 in which the electrode is the surface of a metal plate.

13. The apparatus of claim 10 in which the charge on the electrode is between 5 and 80 KV.

14. The apparatus of claim 10 in which a charge of between 5 to 80 KV is imposed on a metal plate having a surface above the surface where high intensity heat is applied to said metal surface.

* * * * *